(12) United States Patent
Ecarnot et al.

(10) Patent No.: US 7,892,861 B2
(45) Date of Patent: Feb. 22, 2011

(54) METHOD FOR FABRICATING A COMPOUND-MATERIAL WAFER

(75) Inventors: Ludovic Ecarnot, Vif (FR); Willy Michel, Grenoble (FR); Patrick Reynaud, Saint Martin d'Here (FR); Walter Schwarzenbach, Saint Nazaire les Eymes (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 773 days.

(21) Appl. No.: 11/472,745

(22) Filed: Jun. 21, 2006

(65) Prior Publication Data

US 2007/0231931 A1    Oct. 4, 2007

(30) Foreign Application Priority Data

Mar. 31, 2006    (EP)    ................... 06290542

(51) Int. Cl.
*H01L 21/66*    (2006.01)
(52) U.S. Cl. ................... 438/14; 438/455; 438/458; 257/E21.568
(58) Field of Classification Search .......... 438/455, 438/458, 459
See application file for complete search history.

(56) References Cited

U.S. PATENT DOCUMENTS

2002/0187595 A1    12/2002    Walitzki et al. ............. 438/184

2006/0024915 A1*    2/2006    Kobayashi ................. 438/455
2007/0040181 A1*    2/2007    D'Evelyn et al. ............. 257/94

FOREIGN PATENT DOCUMENTS

EP    1 566 830 A1    8/2005
WO    WO 2004/008527    1/2004

OTHER PUBLICATIONS

M. Kimura et al., XP-000891091 "A New Method for the Precise Measurement of Wafer Roll off of Silicon Polished Wafer",Japanese Journal of Applied Physics, vol. 38,pp. 38-39 (1999).
C. Maleville et al., XP-002389358, " SOI: Challenges And Solutions To Increasing Yield In A Ultrathin Age", Yield Management Solutions, vol. 6, No. 2, pp. 1-84 (2004).

* cited by examiner

*Primary Examiner*—Thanh Nguyen
(74) *Attorney, Agent, or Firm*—Winston & Strawn LLP

(57) ABSTRACT

The present invention provides improved methods for fabricating compound-material wafers, in particular a silicon on insulator type wafer. The improved methods lead to reduced numbers of deflects arising on or near the periphery of the wafers. In a first method, wafers are selected in dependence on edge roll off values determined at about 0.5-2.5 mm away from the edge of the wafer, where edge roll off values are determined in dependence on the second derivative of the wafer height profiles. In a second method, wafers selected according to the first method are further processed by bonding, forming a splitting layer, and detaching the two wafers at the splitting layer.

18 Claims, 5 Drawing Sheets

METHOD FOR FABRICATING A COMPOUND-MATERIAL WAFER

FIELD OF THE INVENTION

The invention relates to a method for fabricating a compound-material wafer, and in particular a silicon insulator (SOI) type wafer, comprising the steps of: providing two wafers and attaching, in particular by bonding, the one wafer to the other. The invention, furthermore, relates to a method for choosing a wafer which is suitable for the fabrication process of a compound-material wafer and to the use of a wafer in the fabrication process of a compound-material wafer.

BACKGROUND OF THE INVENTION

On semiconductor wafer products, and especially on SOI (silicon on insulator) wafer products, defects, in particular voids, can occur in the vicinity of the outer periphery of the compound-material wafer. The outer periphery of wafers with such defects can not be readily used for subsequent semiconductor device fabrication.

One known method for reducing the number of such defects of this type includes carrying out the SOI fabrication process with wafers for which the configuration change is 0.1 nm (nanometer) or less, in a region between 10 mm (millimeter) and 3 mm away from the outer periphery. See, e.g., EP 1566830 (also U.S. publication no. 2006/0024915A1 published Feb. 2, 2006). Alternatively, wafers with a slope of 0.02% or less at a position of 5 mm away from the outer periphery lead to SOI wafers with reduced defects.

Other methods for reducing the number of such defects, and thereby permitting more complete utilization of compound-material wafers, would be advantageous.

SUMMARY OF THE INVENTION

The present invention provides alternative methods for producing compound-material wafers, e.g., SOI wafers, that generate fewer defects in the outer periphery of the compound-material wafers so produced. These methods include alternative methods for choosing wafers which are suitable for the fabrication of compound-material wafers, e.g., SOI wafers, having fewer defects in the outer periphery of the compound-material wafers so chosen.

This invention is based on the inventors' discovery of a surprising new method for producing and/or choosing compound-material wafers. The inventors have discovered that the number of voids and similar defects that are generated close to the periphery of a wafer can be reduced by using in the fabrication process wafers with an edge role off value (ERO) of more than approximately 50 nm, and in particular more than approximately 100 nm, more in particular of more than approximately 150 nm. Approximately is understood to mean a range determined by measurement and calculation uncertainty, or a range of approximately 5%, or a range of approximately 10%.

ERO is determined using the second derivative of the profile of each of the wafers. The term "profile" as used herein to mean a height profile of the wafer in the radial direction, and in particular a radially-oriented height profile of the wafer of the surface at which attachment to another wafer will occur. Furthermore, the two wafers that are attached need not to be of the same material and can optionally include further layers.

The advantages and benefits of this invention are achieved by the following methods for fabricating and/or choosing a compound-material wafer. A preferred method for fabricating a compound-material wafer, in particular a silicon-on-insulator (SOI) type wafer, includes: first, providing two wafers; then, determining an edge roll off (ERO) value of each of the two wafers using the second derivative of the profile of each of the wafers; then using wafers with an ERO of more than approximately 50 nm, or more than approximately 100 nm, or more than approximately 150 nm; and finally, attaching, in particular by bonding, such as molecular bonding one wafer to the other wafer. A preferred method for choosing a compound-material wafer, in particular a silicon-on-insulator (SOI) type wafer, includes: first, determining the second derivative of the profile of the wafer; then establishing the edge roll off (ERO) value of the wafer; then choosing only wafers with an ERO of more than approximately 50 nm, in particular more than approximately 100 nm, more in particular more than approximately 150 nm for use in a are fabrication process.

Preferably, the methods of this invention use 300 mm-type wafers. Since previously known fabricating/choosing methods generate more voids in 300 mm-type wafers than in smaller wafers, the methods of this invention are of particularly advantageous in such larger wafers because they reduce the number of voids in this type of wafers. For even larger wafers, e.g. 450 mm wafers, the method of this invention are also expected to be superior to previously known methods.

In more detail, according to a preferred embodiment, the second derivative of the height profile is used to determine the edge roll in the following manner. First, ERO is determined according to the following relation:

$$ERO=Y(a)-Y(fga).$$

In this relation, "a" and "fqa" correspond to two positions on a radius of the wafer. "Y(a)" corresponds to the height of the wafer at a radial position at which the second derivative of the height profile is zero, i.e., $d^2Y/d^2a=0$. "Y(fga)" corresponds to the height of the wafer at a radial position of between approximately 0.5 mm to 2.5 mm, in particular at approximately 1 mm, away from the outer periphery. Using this method for determining ERO, if both wafers to be bonded have ERO values of more than approximately 50 nm, and in particular of more than approximately 100 nm, even more in particular of more than approximately 150 nm, then even further improved results concerning the defects are achieved.

An alternative preferred embodiment includes a further step of computation of an average value of the ERO from ERO values determined at several positions of the wafer. This alternative is advantageous if the wafers have inhomogeneous wafer edges.

An alternative preferred embodiment includes a further step of providing an insulating layer on at least one of the two wafers prior to attaching/bonding the wafers. In an embodiment, the bonding can be molecular bonding. If ERO values determined as described above using a second derivative method, then reduced numbers of voids are observed for resulting compound-material wafer structures that comprise the provided insulating layer. This alternative is advantageous for SOI-type and similar wafers.

An alternative preferred embodiment includes a further step of forming a predetermined splitting area in one of the wafers. Such a method step is used to enable the transfer of a thin layer of material from one wafer onto the other. If ERO values determined as described above using a second derivative method, then reduced numbers of voids are observed for resulting compound-material wafer structures that are so fabricated. If the methods of this invention are not used, increased numbers of voids are created in the transferred thin layer.

An alternative preferred embodiment includes further steps of determining the ERO of a wafer and choosing of a wafer performed after the step of providing an insulating layer on at least one of the two wafers, or after the additional step of forming a predetermined splitting area in one of the wafers. In this embodiment, the ERO value is determined prior to the bonding of the wafers.

The dependent claims appended hereto recite additional preferred embodiments of the methods of this invention.

Further aspects and details and alternate combinations of the elements of this invention will be apparent from the following detailed description and are also within the scope of the inventor's invention.

BRIEF DESCRIPTION OF THE DRAWINGS

The present invention may be understood more fully by reference to the following detailed description of the preferred embodiment of the present invention, illustrative examples of specific embodiments of the invention and the appended figures in which.

DETAIL DESCRIPTION OF THE PREFERRED EMBODIMENTS

Figure 1A:
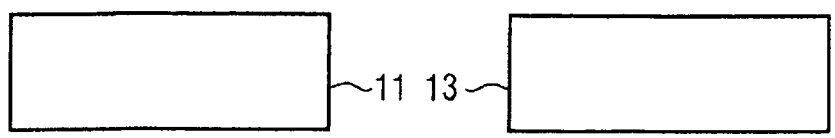
FIGS. 1a-e illustrate a fabrication process of compound-material wafers.
Figure 1B:
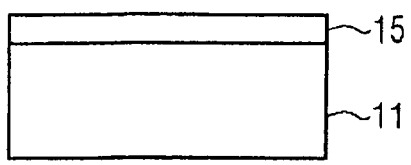
Figure 1C:
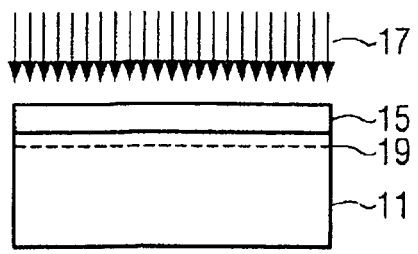
Figure 1D:
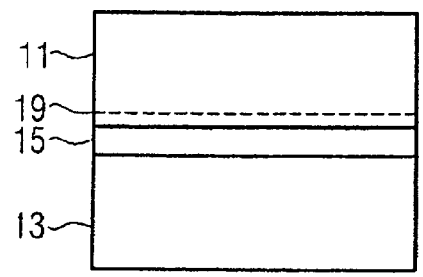
Figure 1E:
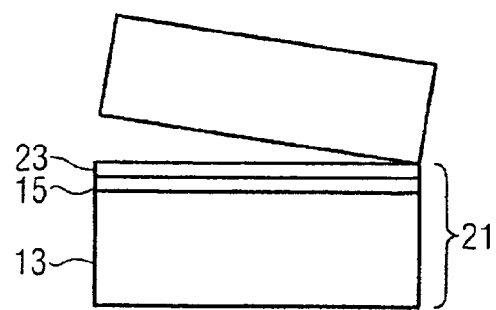

FIGS. 1a-e illustrate a state of the art compound-material fabrication process, applicable in particular to SOI wafers. The process comprises the following steps and will be described in the following as applied to a SOI wafer:

FIG. 1a illustrates a first step of the process in which two Si (silicon) wafers 11 and 13, e.g. 300 mm wafers, are provided. FIG. 1b illustrated a second step in which a thermal oxide layer 15 is grown on wafer 11. During the thermal oxide growth, wafer 11 actually gets encapsulated by the oxide. The oxide on the back and on the side is, however, removed at a later stage. FIG. 1c illustrates a third step in which atomic species 17, e.g., hydrogen ions or rare gas ions, are implanted through the thermal oxide layer 15 into wafer 11 to thereby create a predetermined splitting area 19 inside wafer 11. FIG. 1d illustrates a fourth step in which the second wafer 13 is bonded to wafer 11 such that the oxide layer 15 is positioned between wafer 13 and 11. Then, in a fifth step illustrated by FIG. 1e, energy, in particular thermal energy, is provided to the bonded wafer system so that detachment occurs at the predetermined splitting area 19. Thus, this process creates a silicon on insulator wafer 21 comprising the initial wafer 13, the oxide layer 15 and a transferred layer 23 which originated from wafer 11.

In addition to SOI wafer 21, this process can also fabricate other types of compound-material wafers such as: strained silicon on insulator (sSOI), silicon-germanium on insulator (SiGeOI), germanium on insulator (GeOI), silicon on quartz (SOLI), and direct silicon bonding wafers (DSB). In addition, further layers of materials may be present.

Figure 2A:
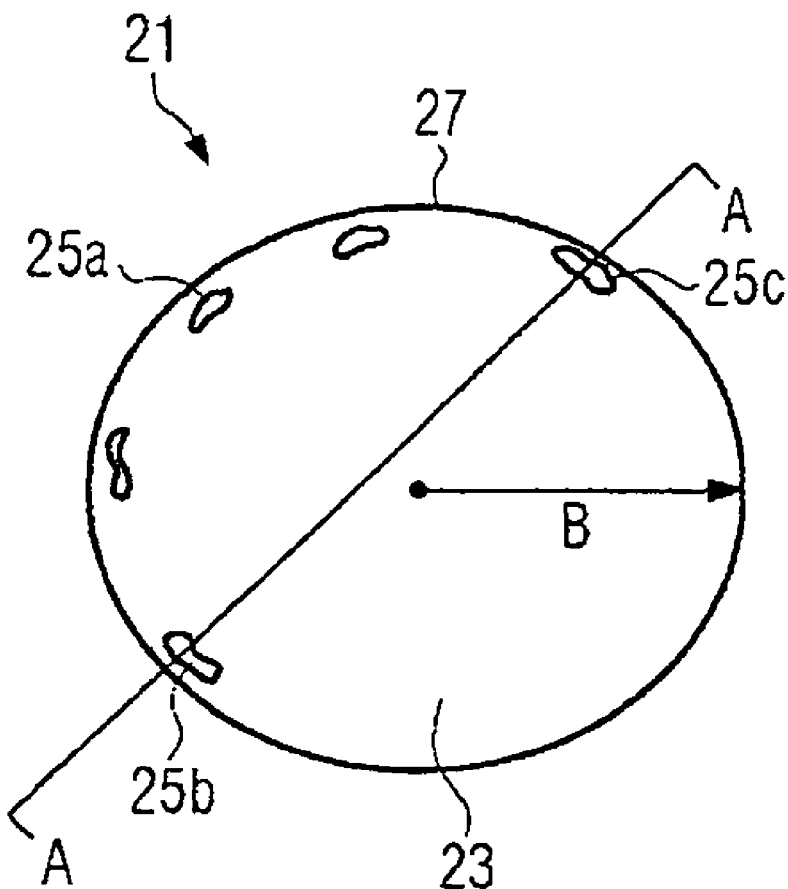
FIGS. 2a-b illustrate a compound-material wafer with defects close to the outer periphery in a top view and in a crosscut view.

FIG. 2a illustrates a top view of SOI wafer 21 obtained by the above-described process. On the surface of the transferred layer 23, defects 25a, 25b, 25c, etc. can be observed. They are positioned at about 3 mm away from the edge 27 of the SOI wafer 21 and at other positions in the outer periphery of wafer 21. The size of the defects in the figure is exaggerated for illustrative purposes. In reality, the defects often have a size of approximately 1 mm in diameter.

Figure 2B:
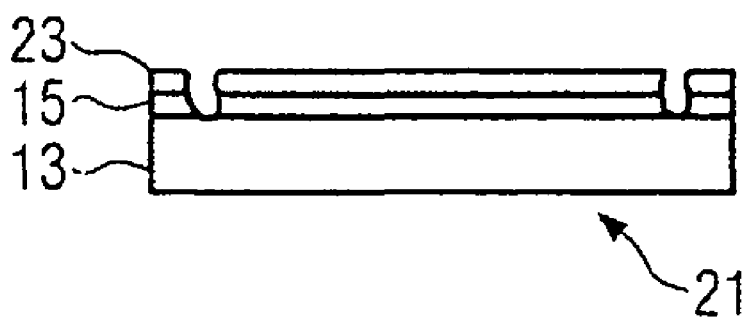

FIG. 2b illustrates a cross cut along line AA shown in FIG. 2a. It can be seen that the defects 25b and 25c correspond to areas where the transfer of layer 23 was not complete. These voids can go the whole way through the transferred layer and the insulating layer 15 to reach the interface at which bonding occurred. These defects are usually attributed to bonding defects. When two wafers are bonded, they are actually put into close contact to each other and then a pressure is applied, typically on one edge of the wafer. At an edge opposite to the point where bonding has been initiated, perturbations of the bonding wafer can occur, e.g. due to a locally lower bonding force, which perturbations then can lead to the observed defects.

Figure 3:
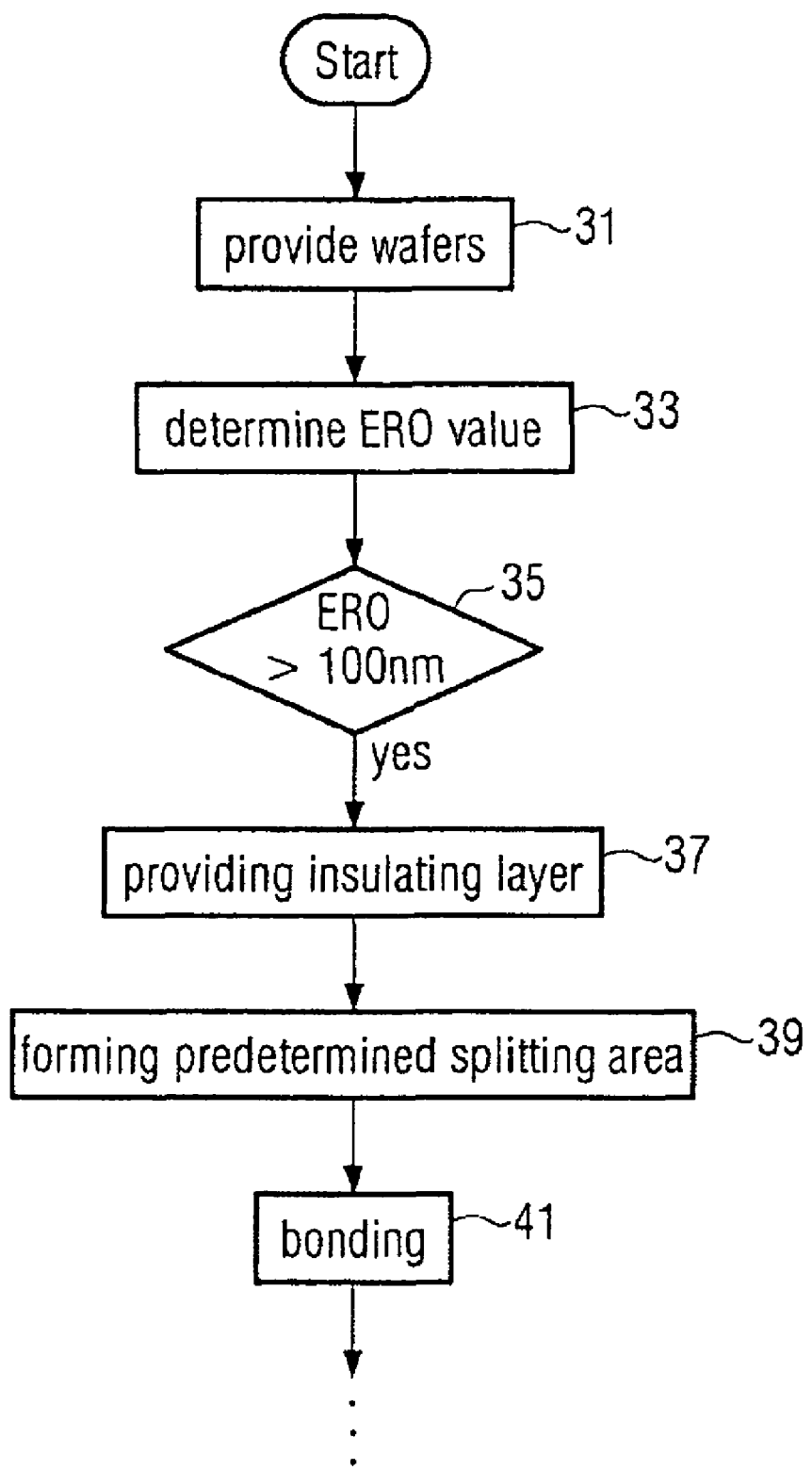
FIG. 3 illustrates a block diagram of an embodiment of the inventive method for fabricating a compound-material wafer.

FIG. 3 is a block diagram illustrating an embodiment of the inventive method for manufacturing compound-material wafers. This method allows a reduction of the described type of defects, at least when averaged over a certain number of wafers, for example, over about 10,000 wafers.

The first step 31 consists in providing two wafers. Next in step 33, the edge roll off value of each of the wafers is determined. An embodiment preferred in the case of bonding defects 25a, 25b and 25c illustrated in FIGS. 2a and 2b, which are predominantly located up to about 3 mm from the edge 27 of the compound-material wafer 21, determines the edge roll off (ERO) value preferably at approximately 0.5 mm-2.5 mm, in particular, at approximately 1 mm, away from the outer periphery 27 of the wafers 11 and 13. Generally, ERO values should be determined at about the region of the outer periphery of compound-material wafers where defects occur.

According to the invention the edge roll off value is determined using the second derivative of the profile of the wafers, "Y(r)". The profile. "Y(r)" corresponds to the height profile in the radial direction, r, usually expressed in nm, of the surface regions where attachment will subsequently occur. Alternatively, the wafer thickness profile may be used. The edge roll off value is determined using the second derivative of the profile of the wafer, and is defined by:

$$ERO = Y(a) - Y(fqa) \qquad (1)$$

Thus ERO, when expressed in nm, is the difference in nm of height (or thickness) between two locations, namely the location at radius "a" and at radius "qa". In the case of a 300 mm diameter wafer, the value of "fqa" is preferably chosen to be in a the range of a radius of approximately 147.5 mm to approximately 149.5 mm, in particular, at a radius of approximately 149 mm. For wafers of other diameters, this position is chosen at a similar relative location in the outer periphery.

The value of "a" is preferably chosen in dependence on the value of "fqa". For example, the value of "a" can be chosen to correspond to the first position starting from "fqa" in the direction towards the center at which the second derivative of "Y(r)", that is $d^2Y/d^2a$, is equal to zero, that is $d^2Y/d^2a = 0$.

Figure 4:
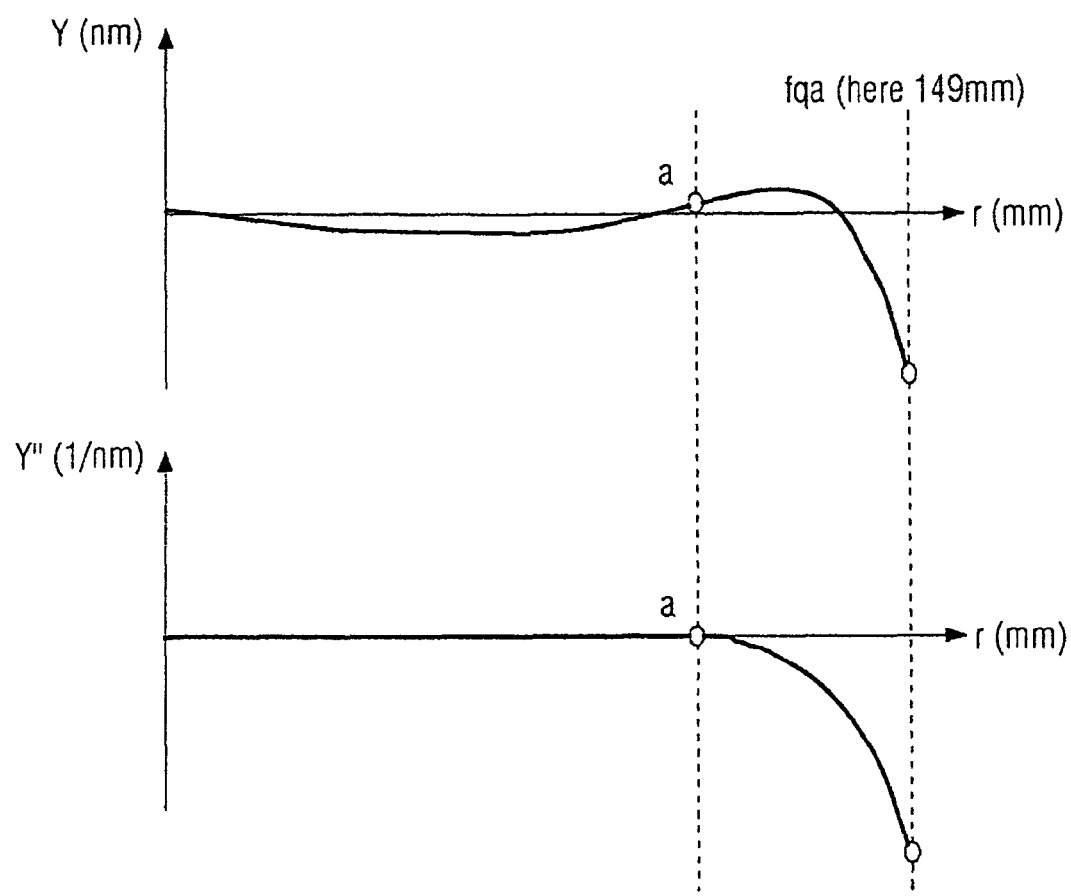
FIG. 4 illustrates a method for determining the edge roll off value using the second derivative.

The second derivative is preferably determined using a numerical process based on the profile measurement of the wafers. It is determined at several positions of the wafer and from the individual values, an average ERO value can be calculated, e.g. from the measured profile itself or by reintegrating twice the second derivative profile. Double integration is typically used to filter out erroneous contributions to the ERO value, which can be due to a misalignment of the wafer on the measurement chuck leading, e.g., to a slightly skipped wafer, FIG. 4 illustrates this process. The top view illustrates the height profile of a wafer which is determined in the radial direction at one or more positions on the wafer, for example along line B shown in FIG. 2a. The second derivative is illustrated in the bottom view. It is numerically calculated using the height profile. Using this data, the position "a" for which the second derivative is zero is determined. Then the corresponding wafer heights "Y(a)" and "Y(fga)" are determined from which in turn the ERO value is calculated using equation (1).

Returning to FIG. 3, in the step 35, only such wafers are chosen for further processing which have an ERO value of more than approximately 50 nm, in particular more than approximately 100 run. Approximately is understood to mean a range determined by measurement and calculation uncertainty, or a range of approximately 5%, or a range of approximately 10%. Using such wafers, in step 37, an insulating layer, which similar to layer 15 illustrated in FIG. 1b, is provided on at least one of the two wafers (step 37). In step 39, a predetermined splitting area, which similar to layer 19 illustrated in FIG. 1c, is then provided. Then in step 41, which is similar to the step illustrated in FIG. 1d, the wafers are attached (or bonded) to each other. Other aspects of these steps are also similar to corresponding steps illustrated in FIGS. 1a-e.

In alternative embodiments, the ERO value determining step 33 and the choosing step 35 can be performed after insulating layer 15 is provided on at least one of the two wafers 11 and 13. In alternative embodiments, these steps for determining ERO can also be performed after predetermined splitting area 17 is formed in one of the wafers 11 and 13. In alternative embodiments, the invention can include methods comprising steps 33 and 35 which can be performed for choosing a wafer that is suitable for a subsequent fabrication process of a compound-material wafer. The subsequent fabrication process can be similar to the one illustrated in FIGS. 1a-e.

EXAMPLE

Figure 5:
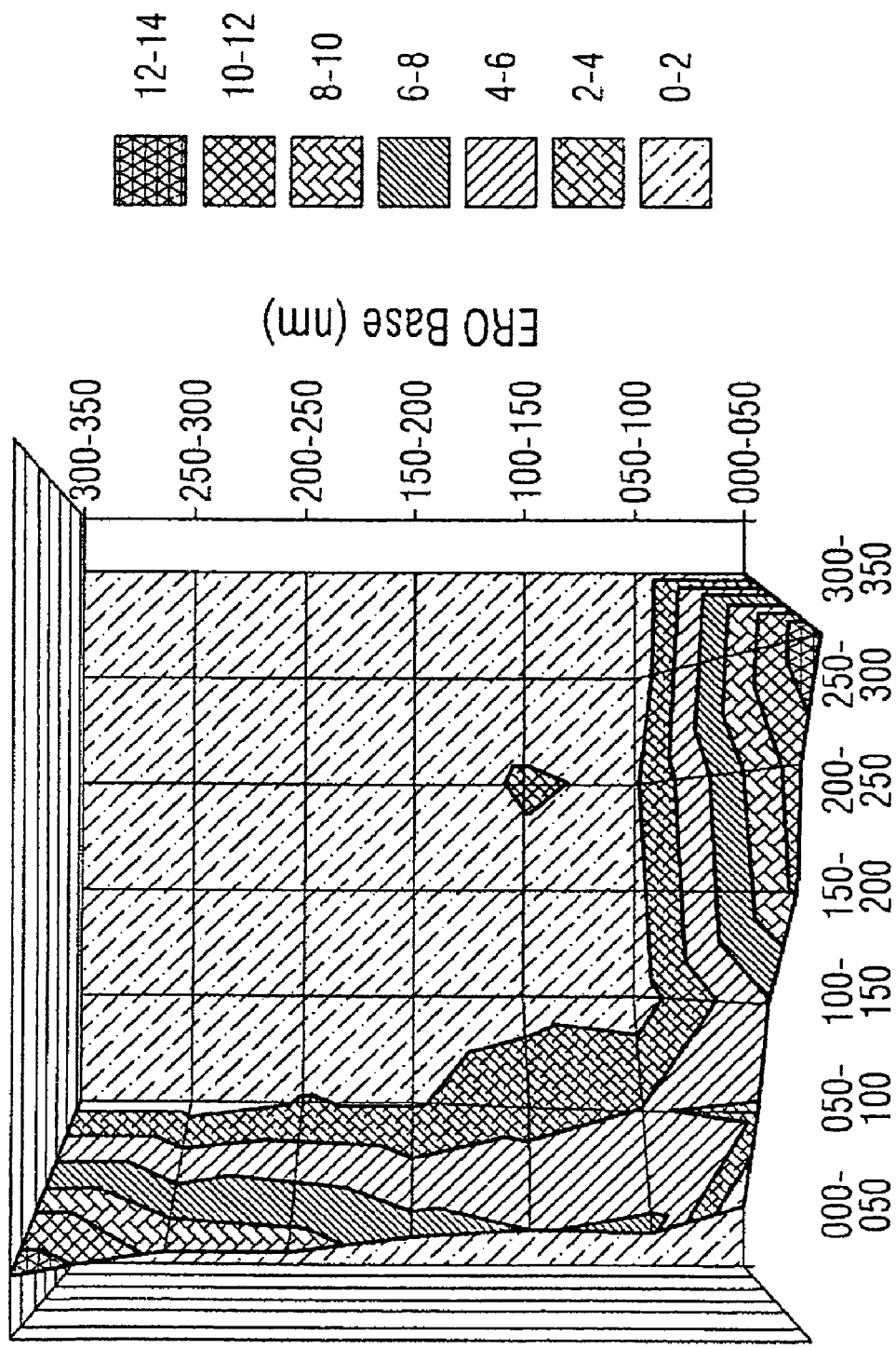
FIG. 5 illustrates a three-dimensional diagram representing the average number of void defects as a function of the ERO value of two wafers that are used in the fabrication process of a compound-material wafer according to this invention.

FIG. 5 illustrates an example showing the advantageous effects of using wafers which have an edge roll off value of more than approximately 50 nm, in particular, more than approximately 100 nm, and even more in particular, more than approximately 150 nm (up to approximately 500 nm). This figure presents a three-dimensional diagram wherein the average number of crystalline defects for a sample of 10,000 wafers (defect numbers are indicated by shadings is plotted against the determined edge roll off values (ERO values indicated along the vertical and horizontal axes) of both first wafer 11 serving as a donor substrate and second wafer 13 serving as a support substrate in the fabrication of an SOI wafer. The ERO values were determined according to equation (1), namely, $$ERO = Y(a) - Y(fqa)$$

where
fqa=149 mm.

300 mm wafers were used. The wafers were analyzed using a Raytex DynaSearch tool which establishes the ERO value based on the second derivative.

As can be clearly seen, the number of defects (of types similar to those illustrated in FIGS. 2a-b) averaged two or more when the ERO values were less than 100 nm, and averaged ten or more when the ERO values for both wafers were less than 50 nm and. The ERO values have been determined using the double derivative method. On the other hand, the number of these defects averaged two or less when the ERO values of both wafers are more than 100 nm.

This example illustrates the advantages of the present invention for producing compound-material wafers such as SOI wafers.

The preferred embodiments of the invention described above do not limit the scope of the invention, since these embodiments are illustrations of several preferred aspects of the invention. Any equivalent embodiments are intended to be within the scope of this invention. Indeed, various modifications of the invention in addition to those shown and described herein, such as alternate useful combinations of the elements described, will become apparent to those skilled in the art from the subsequent description. Such modifications are also intended to fall within the scope of the appended claims. In the following (and in the application as a whole), headings and legends are used for clarity and convenience only.

A number of references are cited herein, the entire disclosures of which are incorporated herein, in their entirety, by reference for all purposes. Further, none of these references, regardless of how characterized above, is admitted as prior to the invention of the subject matter claimed herein.

What is claimed is:

1. A method for selecting a wafer that reduces defects close to the periphery when fabricating a compound-material wafer from two or more initial wafers comprising:
    determining a second derivative of the profile of the wafers,
    determining an edge roll off (ERO) value of the wafers in dependence on the determined second derivative,
    selecting two wafers having ERO values of more than approximately 50 nm, and attaching the two selected wafers together, wherein at least one ERO value is determined according to the equation:

$$ERO = Y(a) - Y(fga),$$

wherein "Y(a)" and "Y(fga)" correspond to the height of a wafer at positions "a" and "fga", respectively, on a radius of the wafer,
    wherein "a" is selected so that "Y(a)" corresponds to the height of the wafer for which the second derivative, "$d^2Y(r)/d^2r$", of the height profile, "Y(r)", is zero, r being the radius of the wafer in that derivative, and
    wherein "fga" is selected at a radial edge position of approximately 0.5 mm to approximately 2.5 mm away from the outer periphery of the wafer.

2. The method of claim 1, wherein the selected wafers have ERO values of more than approximately 100 to 150 nm.

3. The method of claim 1, wherein the compound-material wafer comprises a silicon-on-insulator (SOI) type wafer.

4. The method of claim 1, wherein the attaching comprises bonding.

5. The method of claim 4, wherein the bonding is molecular bonding.

6. The method of claim 1, wherein "fga" is selected to be a radial position of approximately 1 mm away from the outer periphery of the wafer.

7. The method of claim 1, wherein each of the wafers is a 300 mm type wafer.

8. The method of claim 1, wherein determining an ERO value further comprises:
   determining candidate ERO values at a plurality of positions on the wafer, and
   determining the ERO value by averaging the candidate ERO values.

9. The method of claim 1, which further comprises providing an insulating layer on at least one of the selected wafers prior to attaching the wafers.

10. The method of claim 9, which further comprises forming a predetermined splitting area in one of the selected wafers.

11. A method for selecting a wafer that reduces defects close to the periphery when fabricating a compound-material wafer comprising:
   determining an edge roll off (ERO) value of the wafer, and
   selecting the wafer if the ERO value of the wafer is more than approximately 50 nm, wherein the ERO value is determined according to the equation:

$$ERO=Y(a)-Y(fga),$$

wherein "Y(a)" and "Y(fga)" correspond to the height of a wafer at positions "a" and "fga", respectively, on a radius of the wafer.
   wherein "a" is selected so that "Y(a)" corresponds to the height of the wafer for which the second derivative, "$d^2Y(r)/d^2r$", of the height profile, "Y(r)", is zero, r being the radius of the wafer in that derivative, and
   wherein "fga" is selected at a radial edge position of approximately 0.5 mm to approximately 2.5 mm away from the outer periphery of the wafer.

12. The method of claim 11, wherein the wafer is selected if the ERO value of the wafer is more than approximately 100 to 150 nm.

13. The method of claim 11, wherein the compound-material wafer to be fabricated is a silicon-on-insulator type wafer.

14. The method of claim 11, which further comprises fabricating a compound-material wafer from the selected wafer.

15. The method of claim 11, which further comprises determining a second derivative of the profile of the wafer, wherein the ERO value is determined dependence on the determined second derivative.

16. The method of claim 11, wherein "fga" is selected to be a radial position of approximately 1 mm away from the outer periphery of the wafer.

17. The method of claim 11, wherein determining an ERO value further comprises:
   determining candidate ERO values at a plurality of positions on the wafer, and
   determining the ERO value by averaging the candidate ERO values.

18. The method of claim 11, wherein the wafer is a 300 mm type wafer.

* * * * *

UNITED STATES PATENT AND TRADEMARK OFFICE
CERTIFICATE OF CORRECTION

| | | |
|---|---|---|
| PATENT NO. | : 7,892,861 B2 | Page 1 of 1 |
| APPLICATION NO. | : 11/472745 | |
| DATED | : February 22, 2011 | |
| INVENTOR(S) | : Ecarnot et al. | |

It is certified that error appears in the above-identified patent and that said Letters Patent is hereby corrected as shown below:

Column 7:
Line 25 (claim 11, line 11), change "wafer." to -- wafer, --.

Signed and Sealed this
Fifth Day of April, 2011

David J. Kappos
*Director of the United States Patent and Trademark Office*